(12) United States Patent
Vaughan

(10) Patent No.: US 10,861,727 B2
(45) Date of Patent: Dec. 8, 2020

(54) SEGMENTED VERTICAL WAFER BOAT

(71) Applicant: Samsung Electronics Co., Ltd., Suwon-si (KR)

(72) Inventor: Larry E. Vaughan, Austin, TX (US)

(73) Assignee: SAMSUNG ELECTRONICS CO., LTD.

( * ) Notice: Subject to any disclaimer, the term of this patent is extended or adjusted under 35 U.S.C. 154(b) by 352 days.

(21) Appl. No.: 15/920,437

(22) Filed: Mar. 13, 2018

(65) Prior Publication Data

US 2019/0287832 A1 Sep. 19, 2019

(51) Int. Cl.
| | | |
|---|---|---|
| *B25B 11/00* | (2006.01) | |
| *H01L 21/673* | (2006.01) | |
| *C23C 16/458* | (2006.01) | |
| *C23C 16/34* | (2006.01) | |
| *H01L 21/67* | (2006.01) | |

(52) U.S. Cl.
CPC ...... *H01L 21/67346* (2013.01); *C23C 16/345* (2013.01); *C23C 16/4583* (2013.01); *H01L 21/67103* (2013.01); *H01L 21/67109* (2013.01); *H01L 21/67115* (2013.01); *H01L 21/67248* (2013.01); *H01L 21/67303* (2013.01); *H01L 21/67306* (2013.01); *H01L 21/67309* (2013.01)

(58) Field of Classification Search
CPC .... B25B 11/00; B25B 11/02; H01L 21/67109
See application file for complete search history.

(56) References Cited

U.S. PATENT DOCUMENTS

| | | | | |
|---|---|---|---|---|
| D404,371 S | * | 1/1999 | Shimazu | D13/182 |
| 5,897,311 A | * | 4/1999 | Nishi | C23C 16/4583 |
| | | | | 432/239 |
| 6,065,615 A | | 5/2000 | Uchiyama et al. | |
| 6,727,191 B2 | * | 4/2004 | Zehavi | H01L 21/324 |
| | | | | 118/724 |
| 6,979,659 B2 | * | 12/2005 | Zehavi | H01L 21/324 |
| | | | | 118/500 |
| 7,484,958 B2 | * | 2/2009 | Kobayashi | H01L 21/67309 |
| | | | | 211/41.18 |
| 8,529,701 B2 | | 9/2013 | Morita et al. | |
| 8,580,671 B2 | | 11/2013 | Horii et al. | |
| 8,851,886 B2 | | 10/2014 | Morita et al. | |

(Continued)

FOREIGN PATENT DOCUMENTS

| | | |
|---|---|---|
| JP | S63217622 A | 9/1988 |
| JP | 2000150403 A | 5/2000 |

*Primary Examiner* — Lee D Wilson
(74) *Attorney, Agent, or Firm* — Renaissance IP Law Group LLP

(57) ABSTRACT

A vertical wafer boat has an upper boat segment and a lower boat segment, with the upper boat segment configured to removably mount on the lower boat segment, and to receive one or more semiconductor substrates. The lower boat segment includes a top plate, a first set of adiabatic plates, and a second set of adiabatic plates. One or more posts connect the top plate, the first set of adiabatic plates, and the second set of adiabatic plates. The first set of adiabatic plates include a first set of gaps separating a first plurality of sections; the second set of adiabatic plates include a second set of gaps separating a second plurality of sections; and the first set of adiabatic plates and the second set of adiabatic plates are interleaved.

18 Claims, 7 Drawing Sheets

(56) References Cited

U.S. PATENT DOCUMENTS

| | | |
|---|---|---|
| 9,666,430 B2 | 5/2017 | Koshi et al. |
| 10,072,892 B2 * | 9/2018 | Liu .................. H01L 21/67109 |
| 2019/0287832 A1 * | 9/2019 | Vaughan ............. C23C 16/4583 |

* cited by examiner

SEGMENTED VERTICAL WAFER BOAT

TECHNICAL FIELD

The present disclosure relates to vertical wafer boats used in semiconductor processing.

BACKGROUND

Semiconductor manufacturing processes may process a number of substrates in parallel within a wafer boat. However, parallel processing of semiconductor substrates, such as silicon wafers, faces challenges to ensure uniform results. These challenges include ensuring processing conditions, such as temperature, are consistent across each substrate. Dummy wafers may be used to create more uniform processing conditions within a wafer boat. However, in silicon nitride deposition processes, dummy wafers face many challenges resulting in a short service lifetime.

SUMMARY

Example embodiments of the inventive concept provide a vertical wafer boat for use in semiconductor processing, including silicon nitride deposition. In an example embodiment, a vertical wafer boat includes an upper boat segment and a lower boat segment. The lower boat segment is configured to removably mount on the lower boat segment, and the upper boat segment may receive one or more semiconductor substrates. The lower boat segment includes a top plate, a first set of one or more adiabatic plates, a second set of one or more adiabatic plates, and one or more posts connecting the top plate, the first set of adiabatic plates, and the second set of adiabatic plates. The first set of adiabatic plates includes a first set of one or more gaps separating the first set of adiabatic plates into a first plurality of sections. The second set of adiabatic plates includes a second set of one or more gaps separating the second set of adiabatic plates into a second plurality of sections. The first set of adiabatic plates are interleaved with the second set of adiabatic plates. The first and second sets of adiabatic plates may include an inner circumference and an outer circumference with the circumferences of the first and second sets of adiabatic plates substantially equal to each other. The outer circumference of the first and second sets of adiabatic plates may be greater than the circumference of the semiconductor substrates, while the inner circumference of the first and second sets of adiabatic plates may be less than the circumference of the semiconductor substrates. The first and second sets of gaps may extend from the inner circumference to the outer circumference in a radial direction, with the first and second sets of gaps being equally spaced, but angularly offset with respect to each other. The vertical wafer boat, including the upper boat segment, the lower boat segment, the first set of adiabatic plates, the second set of adiabatic plates, and the posts may be made of silicon carbide. The lower boat segment may include a lower plate, which is noncontiguous, and mounted on the seal cap of an elevator. The first and second set of adiabatic plates may also be noncontagious with only the top plate being contagious. The first and second sets of adiabatic plates may be distributed vertically between the top and bottom plates, with the posts penetrating each adiabatic plate of the first and second sets of adiabatic plates.

In an example embodiment, a vertical wafer boat is segmented into an upper boat segment configured to removably mount on a lower boat segment and receive one or more semiconductor substrates. The lower boat segment includes one or more adiabatic plates with one or more posts orthogonally penetrating the adiabatic plates. Each adiabatic plate includes one or more gaps separating each plate into a plurality of noncontiguous sections. The upper boat segment may be mounted on the lower boat segment with one or more pins, with the upper boat segment, the lower boat segment and pins formed from silicon carbide. The gaps may include a center circular gap and one or more radial gaps extending from the center circular gap to an outer circumference of the adiabatic plates. Each of the plurality of noncontiguous sections may be penetrated by one or more posts, and each of the posts may be affixed to the adiabatic plates. Each of the plurality of noncontiguous sections may be formed into arcuate shapes centered around the center gap, with the center gap and the radial gaps separating the plurality of noncontiguous sections around an inner circumference. The adiabatic plates may be ring-shaped, with an inner diameter and outer diameter, with the inner diameter defining an inner gap, and one or more radial gaps extend between the inner diameter and the outer diameter.

In an example embodiment, a vertical wafer boat is segmented into an upper boat segment and a lower boat segment. The upper boat segment is configured to mount on the lower boat segment and receive one or more semiconductor substrates. The lower boat segment includes one or more adiabatic plates, the adiabatic plates having an outer diameter greater than the diameter of the semiconductor substrates, with the adiabatic plates being made from silicon carbide. The adiabatic plates may have an inner diameter less than the outer diameter of each of the semiconductor substrates. The adiabatic plates may be separated into a plurality of noncontiguous sections.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

DETAILED DESCRIPTION

Various example embodiments will be described more fully hereinafter with reference to the accompanying drawings. The present inventive concept may, however, be embodied in many alternate forms and should not be construed as limited to the example embodiments set forth herein. Rather, these example embodiments are provided so that this description will be thorough and complete, and will fully convey the scope of the present inventive concept to those skilled in the art.

Semiconductors use silicon nitride (SiN) for a variety of purposes, including as an insulator or an etch mask. Thus, the creation of silicon nitride layers is a critical step during semiconductor processing. A processing method, such as low-pressure chemical vapor deposition (LPCVD), forms a silicon nitride layer on a semiconductor substrate, such as a silicon wafer, or a silicon nitride layer may be formed on previously processed layers of a semiconductor substrate. Advantageously, such chemical vapor deposition processes may process multiple wafers at the same time with the wafers inserted into a vertical wafer boat. For example, a silicon nitride deposition process may use ammonia, $N_2H_3$ or $NH_3$, and Dichlorosilane (DCS), $H_2SiCl_2$, to react within a processing chamber to create a layer of silicon nitride on exposed surfaces within a processing chamber.

Figure 1A:
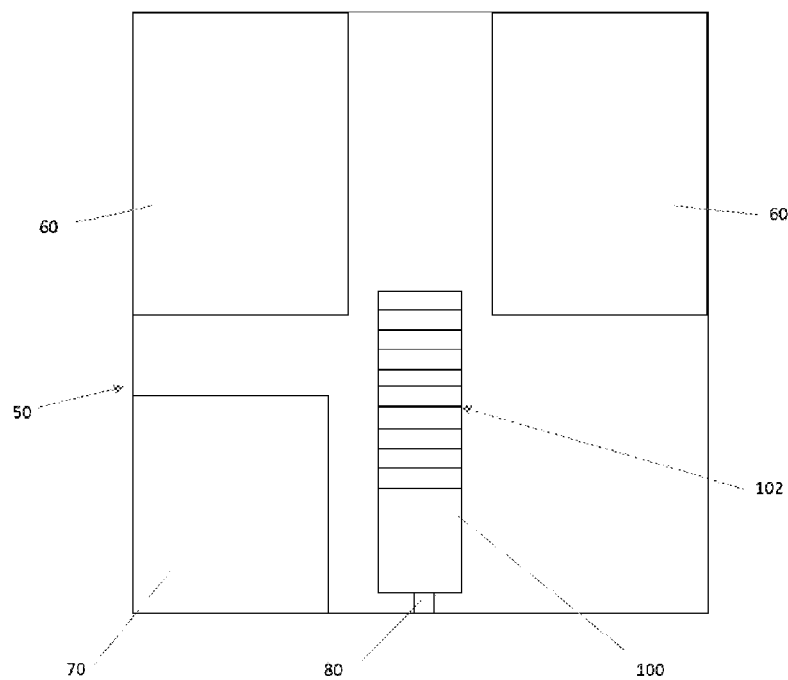
FIG. 1A is a schematic view of a system incorporating a vertical wafer boat in a lowered position according to an example embodiment of the present inventive concept.
Figure 1B:
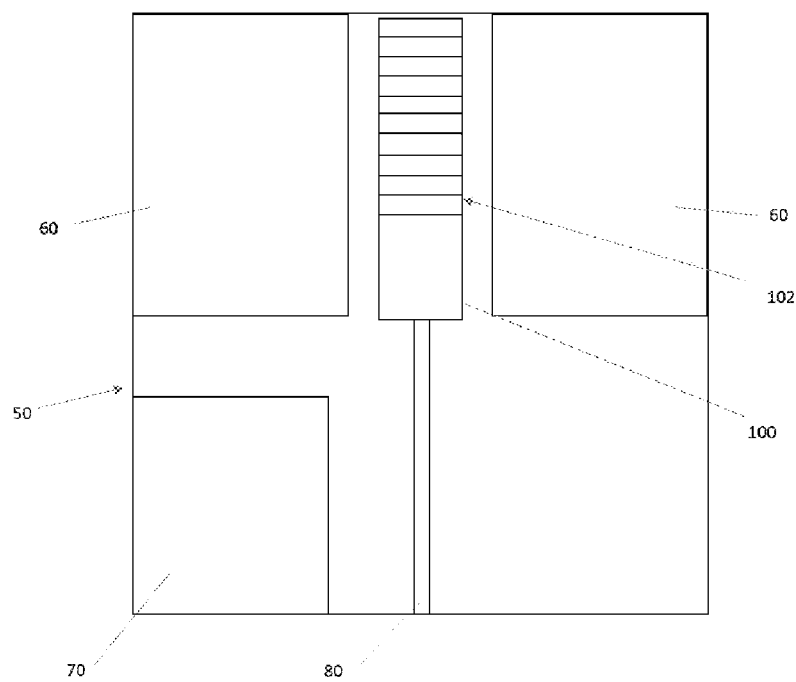
FIG. 1B is a schematic view of a system incorporating a vertical wafer boat in a raised position according to an example embodiment of the present inventive concept.

LPCVD silicon nitride processes require low pressures, such as between 100 and 300 mtorr, and high temperatures, such as between 200-800° C. Thus, processing must take place within a chamber or oven able to reach high temperatures and maintain low pressure. For example, FIG. 1A and FIG. 1B show processing within a process chamber 50, also known as an oven, which includes a heating element 60 for processing semiconductor substrates, such as a plurality of wafers 102, within a vertical wafer boat 100. In the example embodiments herein, the semiconductor substrates are given in the form of a plurality of wafers 102; however, the inventive concept is not limited to silicon wafers and may use any other substrate known in the art, such as germanium, glass, or sapphire. The vertical wafer boat 100 sits on an elevator 80. The elevator 80 raises and lowers the vertical wafer boat 100 within the processing chamber 50. In the lowered position shown in FIG. 1A, a transfer unit 70 may load and unload the plurality of wafers 102 into the vertical wafer boat 100. Loading and unloading of the plurality of wafers 102 are performed at a temperature of around 200° C. In the upper position, shown in FIG. 1B, the vertical wafer boat 100 is within the heating element 60 and may be heated to operating temperatures of around 700° C. Process gases such as DCS and ammonia may then be injected into the processing chamber 50 where they react to produce a silicon nitride film on the exposed surfaces within the processing chamber 50, including the vertical wafer boat 100 and the plurality of wafers 102.

Successful parallel processing of semiconductor substrates generally means achieving uniform results across each substrate and between each substrate. In silicon nitride deposition, the resulting silicon nitride film should be substantially uniform across each wafer, and between each wafer. To achieve uniform results, variables that affect processing, such as temperature, should be substantially uniform for each wafer. However, since LPCVD silicon nitride processes take place at low pressures and high temperatures, heat is more easily transferred via conduction than convection or radiation. Thus, when a plurality of wafers 102 are stacked in a vertical wafer boat 100 on an elevator 80, the plurality of wafers 102 may experience different temperatures depending on where within the vertical wafer boat 100 the plurality of wafers 102 are placed due to heat being conducted via the elevator 80. If the temperature difference between individual wafers is too great, the silicon nitride layers on each wafer may differ in size and quality. A temperature difference of more than plus or minus a half degree Celsius may result in unacceptable differences between wafers.

Figure 2:
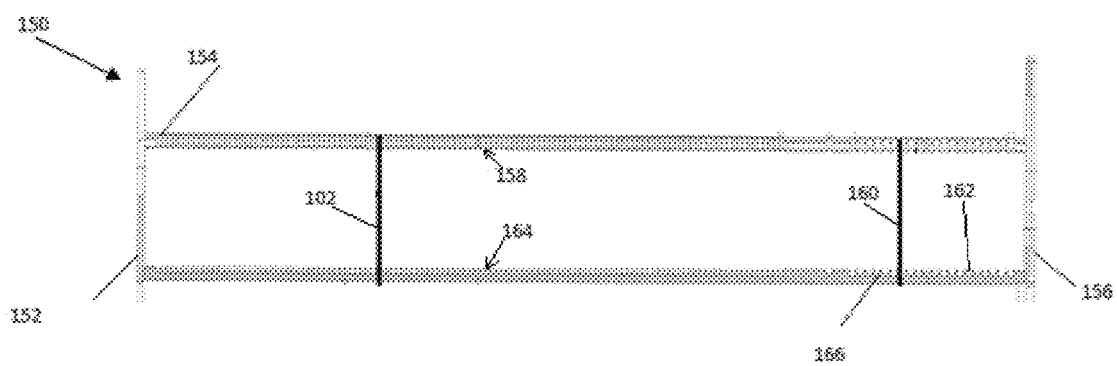
FIG. 2 shows a vertical wafer boat using dummy wafers as insulation.

A previous solution to control temperature differential within the vertical wafer boat 100 uses a plurality of dummy wafers 160 to insulate the plurality of wafers 102 undergoing processing. Shown in FIG. 2 is a vertical wafer boat 150, containing a plurality of wafers 102. The vertical wafer boat 150 includes a top end 152, a bottom end 156, and a plurality of posts 154 between the top end 152 and the bottom end 156. The plurality of posts 154 are vertically aligned, while the top end 152 and the bottom end 156 are horizontally aligned. In FIG. 2, only two of the plurality of posts 154 are shown, although three or more posts are common. Each post of the plurality of posts 154 contains a plurality of slots 158 for removably holding the plurality of wafers 102 in a horizontal alignment. Each individual slot of the plurality of slots 158 has a corresponding slot 164 in the other posts of the plurality of posts 154 to hold the plurality of wafers 102 horizontally within the vertical wafer boat 150.

Furthermore, the vertical wafer boat 150 includes a plurality of dummy wafers 160 removably inserted within a plurality of dummy wafer slots 162. As shown in FIG. 2, a plurality of dummy wafer slots 162 are in each post of the plurality of posts 154, with each individual slot of the plurality of dummy wafer slots 162 having a corresponding slot 166 in the other posts of the plurality of posts 154 such that the plurality of dummy wafers 160 are held horizontally. The plurality of dummy wafers 160 are placed low within the vertical wafer boat 150 such that the plurality of wafers 102 are insulated from the conductive heat transfer between the bottom of the vertical wafer boat 150 and elevator 80. For example, eight quartz plates may be used in a 300-mm process to ensure adequate uniformity between the plurality of wafers 102.

The plurality of dummy wafers 160 used within the vertical wafer boat 150 are typically made of a material with good thermal insulative properties and may be referred to as adiabatic plates. Most often quartz is used. The plurality of dummy wafers 160 remain within the processing chamber 50 during a plurality of processing cycles, each time having additional layers of silicon nitride deposited on to the plurality of dummy wafers 160. During a regular maintenance cycle, the plurality of dummy wafers 160 are removed and cleaned along with the vertical wafer boat 150 to remove built up layers of silicon nitride. Quartz used in the plurality of dummy wafers 160 typically last only four cleaning cycles before the damage caused by cleaning renders the quartz unsuitable. Attempts at using higher density quartz, such as O100, have shown no effect on particle formation.

Figure 3:
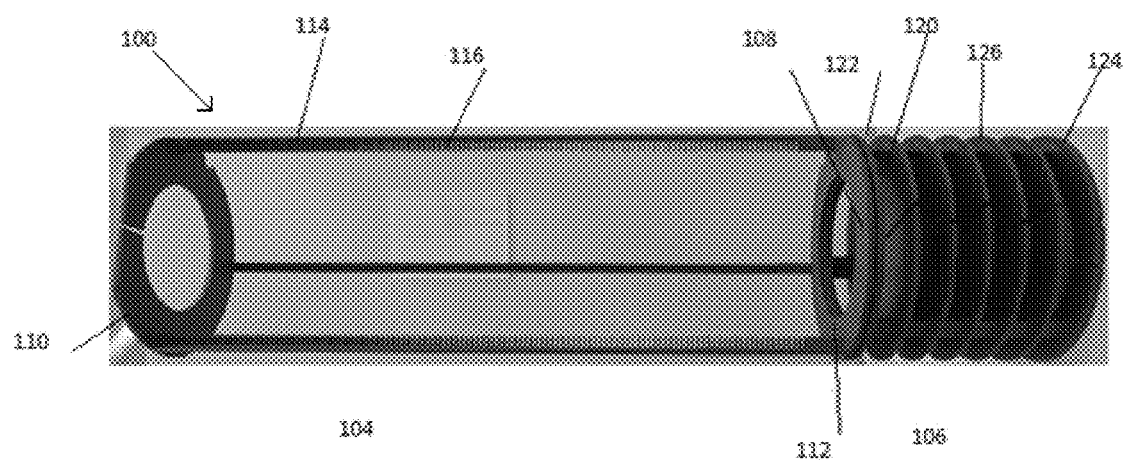
FIG. 3 is a perspective view of a segmented vertical wafer boat according to an example embodiment of the present inventive concept.

In an example embodiment shown in FIG. 3, a vertical wafer boat for holding a plurality of wafers 102 is segmented into an upper boat segment 104 and a lower boat segment 106 to form a segmented vertical wafer boat 100. The upper boat segment 104 includes a top plate 110, a lower plate 112, a plurality of upper boat posts 114, and a plurality of slots 116 in the plurality of upper boat posts 114 to accommodate the plurality of wafers 102. A mechanism for a removable mount 108, such as a plurality of pins, mounts the upper boat segment 104 to the top of the lower boat segment 106. The lower boat segment 106 includes a top plate 122, a bottom plate 124, a plurality of adiabatic plates 120, and a plurality of lower boat posts 126. The removable mount 108 may attach the upper boat segment 104 to the top of the lower boat segment 106 such that the lower plate 112 of the upper boat segment 104 rests on top of the top plate 122 of the lower boat segment 106. The lower boat segment 106 may further have the bottom plate 124 rest on the elevator 80 and may be removably mounted on the elevator 80. Additionally, the removable mount 108 may be a reversible mount, with the upper boat segment 104 mounted on the lower boat segment 106 via a reversible coupling.

Figure 4:
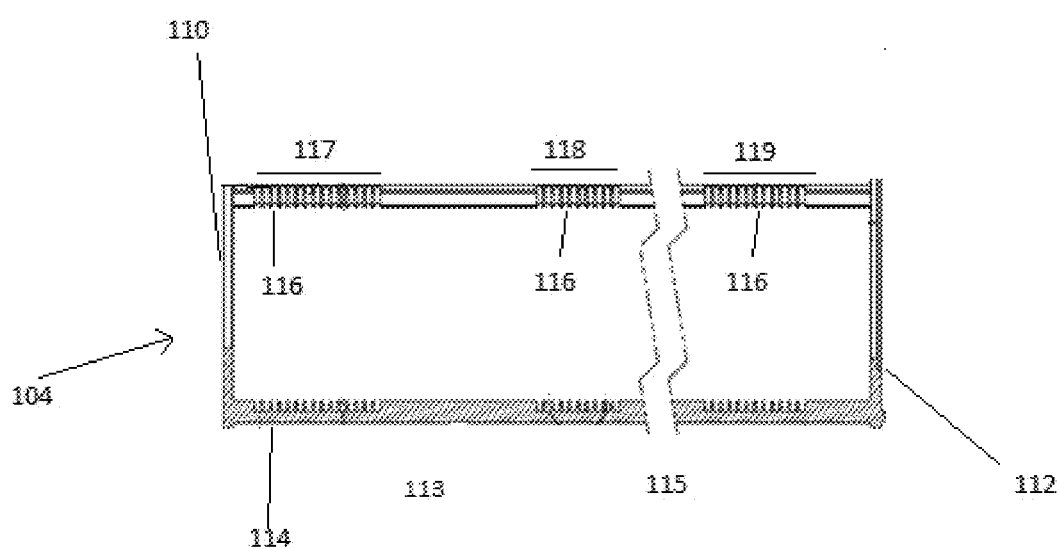
FIG. 4 is a side view of an upper boat segment according to an example embodiment of the present inventive concept.

As further shown by the example embodiments of FIG. 4, and FIGS. 5A-5C, in the upper boat segment 104, the top plate 110 and lower plate 112 are joined by the plurality of upper boat posts 114. In the example embodiment of FIG. 3, the plurality of upper boat posts 114 includes three posts, but in other embodiments, four or more posts may be used. FIG. 4 is an example embodiment showing a side view of the upper boat segment 104 with two of the plurality of upper boat posts 114 shown. The plurality of slots 116 on the plurality of upper boat posts 114 may extend uninterrupted between the top plate 110 and the lower plate 112, as shown in the example embodiment of FIG. 3. However, the example embodiment is purely illustrative, and in other embodiments may differ. In the example embodiment of FIG. 4, the plurality of slots 116 may be broken into multiple series, with a first buffering section 113 and a second buffering section 115 breaking the plurality of slots into a first series of slots 117, a second series of slots 118, and a third series of slots 119. In further embodiments, number of buffering sections and the series of slots may vary.

Figure 5A:
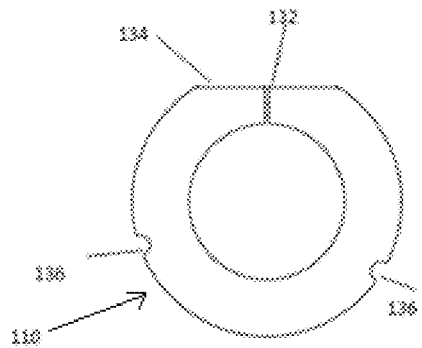
FIG. 5A is a top view of a top plate of an upper boat segment according to an example embodiment of the present inventive concept.
Figure 5B:
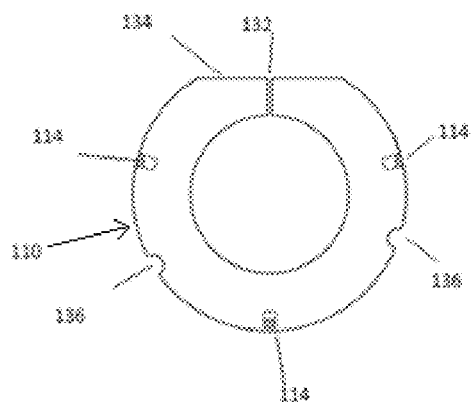
FIG. 5B is a bottom view of a top plate of an upper boat segment according to an example embodiment of the present inventive concept.

In FIG. 5A, the top plate 110 of the upper boat segment 104 is shown from above and is pictured as a substantially circular disc with a large center opening, also known as ring-shaped, although in other embodiments the shape may differ. The top plate 110 has an inner circumference defining a circular opening and an outer circumference defining the outer edge of the top plate 110. A radial gap 132 goes between the inner diameter and outer diameter and allows for the thermal expansion of the top plate 110 when heated to processing conditions. Along the outside circumference of the top plate 110 is a flat end 134, which may overlap with the location of the radial gap 132. The flat end 134 may be, for example, aligned with the flat of semiconductor substrate. Also, along the outside circumference of the top plate 110 are notches 136 that are fitted for one or more thermocouples to attach to the segmented vertical wafer boat 100. As shown in the example embodiment of FIGS. 5A and 5B, the notches 136 may be spaced approximately 120 degrees apart from each other and from the radial gap 132. In FIG. 5B, the plurality of upper boat posts 114 are shown connecting to the top plate 110. For example, the plurality of upper boat posts 114 may include three posts spaced 120 degrees apart from each other. However, in the example of FIG. 5B, the posts are offset approximately 60 degrees from the radial gap 132 and the notches 136.

Figure 5C:
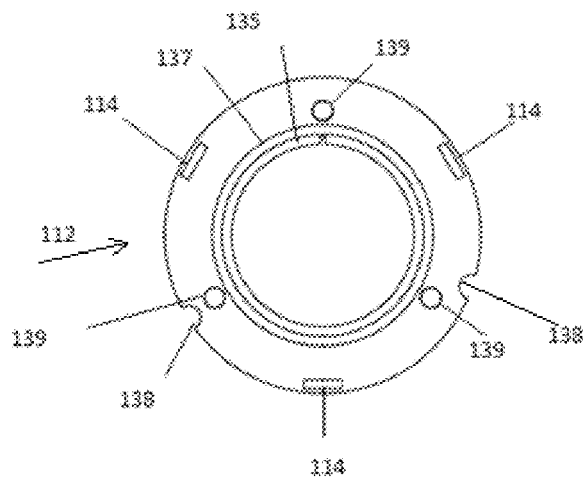
FIG. 5C is a plan view of a lower plate of an upper boat segment according to an example embodiment of the present inventive concept.

The lower plate 112 of the upper boat segment 104 may also be shaped as a substantially circular disc with an opening, also known as ring-shaped, although in other embodiments the shape may differ. FIG. 5C provides a top view of an example embodiment of the lower plate 112, including an inner circumference defining a circular opening and an outer circumference defining the outer edge of the lower plate 112. Along the outer circumference are a second pair of notches 138 that correspond to the notches 136 of the top plate 110 and may be used in conjunction with the notches 136 to hold one or more thermocouples. Furthermore, the plurality of upper boat posts 114 are shown connecting to the lower plate 112 in this example at approximate 120 degrees spacing, and approximately 60 degrees off the spacing of the notches 138. In other embodiments, a different spacing may be used along with a different number of posts. Also present on the lower plate 112 are a plurality of holes 139. The plurality of holes 139 may be, for example, three holes spaced approximate 120 degrees apart on the lower plate 112. The plurality of holes 139 may form part of the removable mount 108, for example, a set of three pins corresponding to the three holes.

The lower boat segment 106 includes a top plate 122, a bottom plate 124, a plurality of lower boat posts 126, and a plurality of adiabatic plates 120. As shown in the example embodiment of FIG. 6 and FIG. 7, the lower boat segment 106 has the top plate 122, the bottom plate 124, and the plurality of adiabatic plates 120 connected by the plurality of lower boat posts 126 that extend vertically from the bottom plate 124 to the top plate 122 and through the plurality of adiabatic plates 120. The top plate 122, the bottom plate 124, and the plurality of adiabatic plates 120 are aligned in a horizontal direction, while the plurality of lower boat posts 126 are aligned in a vertical direction, which may form a cylinder-shaped structure, with the z-axis being the vertical direction. The plurality of lower boat posts 126, as shown in the example embodiments, may be permanently fixed to the top plate 122, the bottom plate 124, and the plurality of adiabatic plates 120. In other embodiments, the connection between the plurality of lower boat posts 126 and one or more of the top plate 122, the bottom plate 124, and the plurality of adiabatic plates 120 may be removable. In the example embodiment shown in FIG. 6 and FIG. 7, the plurality of lower boat posts 126 penetrate the plurality of adiabatic plates 120 with each of the plurality of lower boat posts 126 extending continuously from the top plate 122 to the bottom plate 124. Also shown in the example embodiment of FIG. 6 and FIG. 7, the plurality of lower boat posts 126 may include three posts spaced at approximately 120 degrees apart. In other embodiments, the number of posts and their spacing may vary, for example four posts approximately 90 degrees apart. Further, in the example embodiment of FIG. 6 and FIG. 7, the top plate 122 and the bottom plate 124 are affixed to the ends of the plurality of lower boat posts 126, such as by welding. In other embodiments, the plurality of lower boat posts 126 may include a series of posts between one or more of the plurality of adiabatic plates 120, the top plate 122, and the bottom plate 124. In further embodiments, one or more of the plurality of lower boat posts 126 penetrating one or more of the plurality of adiabatic plates 120, the top plate 122, and the bottom plate 124 may be used in combination with one or more of the plurality of lower boat posts 126 affixed to the surface of one or more of the plurality of adiabatic plates 120, the top plate 122, and the bottom plate 124. Furthermore, the one or more of the plurality of lower boat posts 126 may penetrate orthogonally the one or more of the plurality of adiabatic plates 120. In still further embodiments, one or more of the plurality of lower boat posts 126 may partially penetrate one or more of the plurality of adiabatic plates 120, the top plate 122, and the bottom plate 124. For example, the bottom plate 124 and the top plate 122 may each have one or more of the plurality of lower boat posts 126 penetrate their surface sufficient to enable welding.

The lower boat segment 106, including the all components of the lower boat segment 106, may be made of silicon carbide. For example, the top plate 122, the bottom plate 124, the plurality of lower boat posts 126, and the plurality of adiabatic plates 120 may individually or in any combination thereof may be made of silicon carbide. Further, the removable mount 108 may also be made of silicon carbide, for example, the removable mount 108 may be three silicon carbide pins connecting a lower boat segment 106 made of silicon carbide, with an upper boat segment 104 also made of silicon carbide. In the example embodiments of FIG. 6 and FIG. 7, the top plate 122, the bottom plate 124, the plurality of lower boat posts 126, and the plurality of adiabatic plates 120 are all made of silicon carbide. By using silicon carbide, the components, especially the plurality of adiabatic plates 120, have an increased resistance to the cleaning process, and thus a longer service lifetime. Even further, because the plurality of adiabatic plates 120 may be made of the same material as the rest of the lower boat segment 106, the thermal expansion during a processing cycle is consistent. The consistent thermal expansion allows the plurality of adiabatic plates 120 to be permanently affixed to the rest of the lower boat segment 106, such as by welding or other processes known in the art.

By using the same material with the same thermal expansion for the plurality of adiabatic plate 120 as the rest of the lower boat segment 106, the stress on connections is minimized as the components may expand and contract at the same rate. Further, by using permanently affixed plates rather than the plurality of dummy wafers 160, the plurality of adiabatic plates 120 may be cleaned without the same risk of chipping or breaking, as the lower boat segment 106 may be removed without having to slide plates in and out. Additionally, because silicon carbide better matches the thermal expansion of silicon nitride compared to materials such as quartz, flaking caused by differences in the thermal expansion is reduced, thereby lowering the particle counts and contamination of the silicon nitride deposition processes. Also, because the plurality of adiabatic plates 120 may be permanently affixed to the lower boat segment 106, the plurality of adiabatic plates 120 may be divided into individual sections attached to each of the plurality of lower boat posts 126.

Figure 8A:
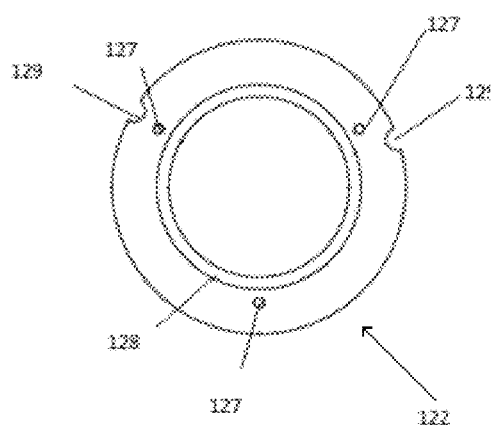
FIG. 8A is a plan view of a top plate of a lower boat segment according to an example embodiment of the present inventive concept.

The lower boat segment 106 has the top plate 122 and bottom plate 124 differing from the plurality of adiabatic plates 120. Although each plate is roughly circular with an opening, including an inner circumference and an outer circumference such as to form a ring, the structure of each plate differs. For example, the lower boat segment 106 has mounting features on the top plate 122 corresponding to the removable mount 108. In the example embodiment of FIG. 8A, the top plate 122 is shown with holes 127 for use in mounting, which may correspond with the holes 139 in the lower plate 112 of the upper boat segment 104. In the example embodiment of FIG. 3, the removable mount 108 may include a set of pins passing through the holes 127 and the holes 139. Thus, the holes 127 on the top plate 122 may substantially match the diameter and location of the holes 139 on the lower plate 112. The top plate 122 of the lower boat segment 106 may also include a ring 128 around the inner circumference of the top plate 122. The ring 128 may match the inner diameter of the lower plate 112 of the upper boat segment 104, and further may correspond to an inner mounting ring 135 of the lower plate 112 of the upper boat segment 104. Additionally, the lower plate 112 of the upper boat segment 104 may have an outer mounting ring 137, with the inner mounting ring 135 and the outer mounting ring 137 working with the ring 128 to further hold the upper boat segment 104 on the lower boat segment 106. In other embodiments, alternative forms of coupling the upper boat segment 104 and the lower boat segment 106 may be used and reflected in the lower plate 112 and the top plate 122. For example, pairs of catches, screws, fasteners, clasps, clamps, interlocking grooves, and any other known form of coupling may be used alone or in combination. Furthermore, a plurality of notches 129 may be formed along the outer circumference of the top plate 122. In the example embodiment of FIG. 8A, the plurality of notches 129 may correspond to notches 136 and notches 138 in the upper boat segment 104, including being spaced approximately 120 degrees apart. Such a plurality of notches 129 may be sized to fit a thermocouple in the segmented vertical wafer boat 100.

Figure 8B:
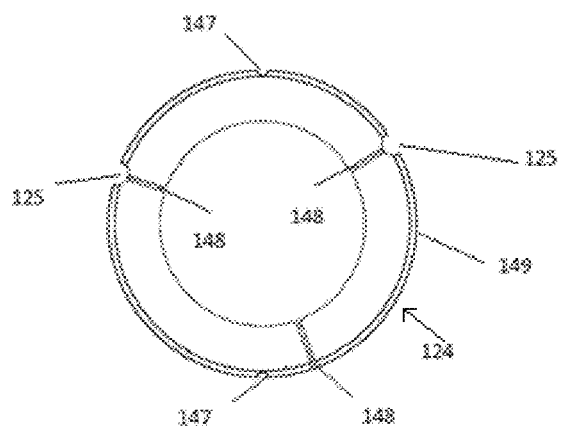
FIG. 8B is a plan view of a lower plate of a lower boat segment according to an example embodiment of the present inventive concept.

The bottom plate 124 of the lower boat segment 106 may also be generally circular to match the shape of the vertical wafer boat 150. Furthermore, the bottom plate 124 may include a plurality of features for mounting the segmented vertical wafer boat 100 to an elevator 80. In the example embodiment of FIG. 8B, the bottom plate 124 may include a circular disc with an inner circumference and outer circumference to form a ring shape. The inner circumference of the bottom plate 124 may be spaced to fit around a seal cap of the elevator 80, such that the bottom plate 124 of the lower boat segment 106 of the segmented vertical wafer boat 100 is configured to mount on the seal cap. Furthermore, the outer circumference of the bottom plate 124 may include a lip 149 around the outer circumference, which may match a corresponding groove on the elevator 80. The outer circumference of the bottom plate 124 and the lip 149 may have a plurality of notches 125 at approximately 120 degrees apart. The notches are sized to a thermocouple and may correspond to and be aligned with the notches 136 and the notches 138 in the upper boat segment 104 as well as the plurality of notches 129 in the top plate 122, allowing a thermocouple to traverse the entire vertical length of the segmented vertical wafer boat 100. Additionally, a set mounting spots 147 on the outer circumference of the bottom plate 124 may also be used to secure the bottom plate 124 to the elevator 80 and match equivalent features on the elevator 80.

Furthermore, the bottom plate 124 may be noncontiguous with a plurality of gaps 148 separating the bottom plate 124 into a plurality of noncontiguous sections. The plurality of gaps 148 may extend between the inner circumference of the bottom plate 124 and the outer circumference of the bottom plate 124. The plurality of gaps 148 may be spaced at an equal distance apart, with each gap having the same distance to every other gap. Further, as shown in the example embodiment of FIG. 8B, the plurality of gaps 148 may be oriented in a radial direction with respect to the center of the bottom plate 124 to form a plurality of radial gaps. In other embodiments, the plurality of gaps 148 may extend in both an angular direction and a radial direction. If the bottom plate 124 is separated into a plurality of noncontiguous sections, the plurality of gaps 148 may serve a number of functions. For example, the plurality of gaps 148 provide space for thermal expansion during the processing cycle. Each gap of the plurality of gaps 148 may be spaced wide enough to allow each of the sections of the bottom plate 124 to expand when the segmented vertical wafer boat 100 is heated to an operating temperature of 700° C. Additionally, the plurality of gaps 148 provide each of the plurality of sections of the bottom plate 124 with thermal insulation from the other sections of the bottom plate 124 and provide thermal insulation between each of the plurality of lower boat posts 126. As seen in the example embodiment of FIGS. 6 and 7, the bottom plate 124 includes three noncontiguous sections separated by three gaps 148, and each section corresponds to one of the plurality of lower boat posts 126. Thus, if the bottom plate 124 is noncontiguous, the plurality of gaps 148 act to prevent conductive heat transfer between each of the plurality of lower boat posts 126. Even furthermore, the plurality of gaps 148 increase the surface area of the bottom plate 124, thus decreasing the conductive heat transfer while increasing convective and radiative heat transfer. The plurality of gaps 148 in the bottom plate 124 fulfill similar roles as a plurality of gaps 146 in the plurality of adiabatic plates 120 as detailed below.

Figure 9A:
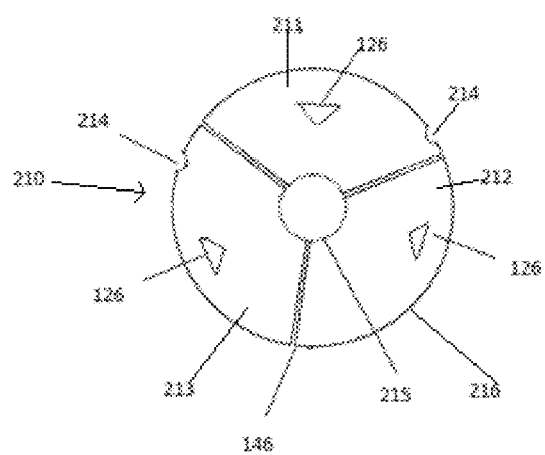
FIG. 9A is a plan view of a first set of adiabatic plates of a lower boat segment according to an example embodiment of the present inventive concept.
Figure 9B:
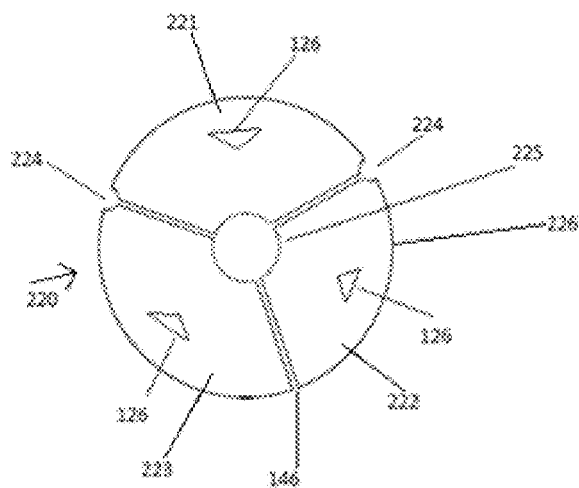
FIG. 9B is a plan view of a second set of adiabatic plates of a lower boat segment according to an example embodiment of the present inventive concept.

The plurality of adiabatic plates 120 in the lower boat segment 106 may fulfill the same basic role as the plurality of dummy wafers 160 in the vertical wafer boat 150 in regulating the temperature of the plurality of wafers 102. However, the plurality of adiabatic plates 120 feature a number of differences and advantages over the plurality of dummy wafers 160, including being made of silicon carbide. The plurality of adiabatic plates 120, as shown in the example embodiment of FIG. 6 and FIG. 7, may include five plates, a first adiabatic plate 141, a second adiabatic plate 142, a third adiabatic plate 143, a fourth adiabatic plate 144, and a fifth adiabatic plate 145. In other embodiments, the number of plates may differ. The plurality of adiabatic plates 120 may be also divided into two sets of plates. An example embodiment of a first set of plates 210 including the odd numbered plates of the plurality of adiabatic plates 120, including the first adiabatic plate 141, the third adiabatic plate 143 and the fifth adiabatic plate 145, is shown in FIG. 9A. An example embodiment of a second set of plates 220 including the even numbered plates of the plurality of adiabatic plates 120, including the second adiabatic plate 142 and the fourth adiabatic plate 144, is shown in FIG. 9B. Both the first set of plates 210 and the second set of plates 220 share a same general layout, with a primary difference being the alignment of the plurality of gaps 146 in each of the plurality of adiabatic plates 120. In the example embodiment of FIG. 6 and FIG. 7, the first set of plates 210 and the second set of plates 220 are interleaved, with one plate of the first set of plates 210, alternating with at least one plate of the second set of plates 220. In additional embodiments, further sets of plates may exist with additional alignment configurations and be interleaved with the first set of plates 210 and the second set of plates 220. In still further embodiments, the first set of plates 210 and the second set of plates 220 may alternate with a pair of each plate alternating with a pair of each other plate. The first set of plates 210 and the second set of plates 220 differ in the orientation of the plurality of gaps 146. In the first set of plates 210, the plurality of gaps 146 are offset from a set of notches 214. In the second set of plates 220, the plurality of gaps 146 are aligned with a set of notches 224. Thus, the first set of plates 210 and the second set of plates 220 have their plurality of gaps 146 angularly offset from one another. Additionally, the set of notches 214 and the set of notches 224 are sized to a thermocouple and may correspond to and be vertically aligned with notches 136 and notches 138 in the upper boat segment 104, as well as the plurality of notches 129 in the top plate 122, and the plurality of notches 125 in the bottom plate 124.

The plurality of adiabatic plates 120, although divided into the first set of plates 210 and the second set of plates 220, share the same corresponding features, only shifted angularly with respect to each other. Both the first set of plates 210 and the second set of plates are shaped like a substantially circular disc with an inner circumference and an outer circumference, forming a ring. In the first set of plates 210, a first inner circumference 215 defines a center gap that the first set of plates 210 are centered around. In the second set of plates 220, a second inner circumference 225 defines a center gap that the first set of plates 220 are centered around. The center gap of the first set of plates 210 and the second set of plates 220 may be circular to create a circular center gap, also known as an inner gap. The center gap of the first set of plates 210 and the second set of plates 220 are vertically aligned. In the example embodiments of FIG. 9A and FIG. 9B, the first inner circumference 215 and the second inner circumference 225 have the same radius. Additionally, the first set of plates 210 has a first outer circumference 216 while the second set of plates 220 has a second outer circumference 226.

In the example embodiment shown in FIG. 9A and FIG. 9B, the first outer circumference 216 and the second outer circumference 226 have the same radius. However, the example embodiment is purely illustrative, and in other embodiments, either the inner circumference or the outer circumference may vary between sets of plates. However, the first inner circumference 215 and the second inner circumference 225 are sized so the plurality of adiabatic plates 120 have no inner circumference when the segmented vertical wafer boat 100 is heated to an operating temperature of 700° C. or more. In other embodiments inner circumference may remain when the plurality of adiabatic plates 120 are heated to an operating temperature of 700° C. or more. The center gap thus gives room for thermal expansion of the plurality adiabatic plates 120 on the inside of the segmented vertical wafer boat 100. The plurality of gaps 146 also give additional room for thermal expansion for the plurality of adiabatic plates 120, breaking the adiabatic plates 120 into a plurality of sections. For example, the first set of plates 210 is broken up by the plurality of gaps 146 into three sections, a first section 211, a second section 212, and a third section 213. The second set of plates 220 is also broken up into three sections by the plurality of gaps 146, a fourth section 221, a fifth section 222, and a sixth section 223. In further embodiments, the plurality of adiabatic plates 120 may be broken into any number of sections. Additionally, the plurality of gaps 146 may be spaced such that each gap is equally spaced, with the spacing between each gap being the same. As a result of the spacing of the plurality of gaps 146 being equal, the first section 211, the second section 212, the third section 213, the fourth section 221, the fifth section 222, and the sixth section 223 may have the same area.

Additionally, each gap of the plurality of gaps 146 may extend from the inner circumference to the outer circumference, making the plurality of adiabatic plates 120 noncontiguous. If, as in the example embodiment of FIG. 9A and FIG. 9B, the plurality of adiabatic plates 120 are noncontiguous, the number of noncontiguous sections may match the number of the plurality of lower boat posts 126, as each noncontiguous section is held in place by a post. In the example embodiments of FIG. 9A and FIG. 9B, the sections have an arc shape, or an arcuate shape, while in other embodiments, the shape of the sections may include any other shape known in the art. In further embodiments, the extent of the plurality of gaps 146 may differ, with some of the plurality of gaps 146 extending only partially between the inner circumference and the outer circumference. In further embodiments, the spacing of the plurality of gaps 146 may also differ between at least one gap and at least one other gap.

The plurality of lower boat posts 126 may penetrate each of the plurality of adiabatic plates 120. The plurality of lower boat posts 126 may each extend between the top plate 122 and the bottom plate 124, penetrating each of the plurality of adiabatic plates 120. As shown in FIGS. 6, 7, and 9A-9B, the plurality of lower boat posts 126 may have a triangular cross-section, with one side facing radially out, and an opposite vertex facing radially inwards. The triangular shape of the plurality of lower boat posts 126 corresponds to openings in the plurality of adiabatic plates 120, allowing the plurality of lower boat posts 126 to pass through the plurality of adiabatic plates 120. The plurality of lower boat posts 126 and the plurality of adiabatic plates 120 may be joined by welding each plate to each post. Alternatively, each post may be welded to each plate. In further embodiments, other methods of joining may be used, including rivets, screws, fasteners, clasps, etc. These methods of joining may be either permanent or reversible. The number of posts of the plurality of lower boat posts 126 may correspond to the number of sections in each of the plurality of adiabatic plates 120. In other embodiments, a post may connect to a plurality of sections in each of the plurality of adiabatic plates 120 by being affixed to the side of each plate.

If each section is affixed to a post, the sections may noncontagious. Thus, the first set of plates 210 has, as shown by the example embodiment of FIG. 9A, the first section 211, the second section 212, and the third section 213 as noncontiguous sections separated by the plurality of gaps 146, each noncontiguous section with a corresponding post of the plurality of lower boat posts 126 holding each of the first section 211, the second section 212, and the third section 213 in place. The second set of plates 220 also has, as shown by the example embodiment of FIG. 9B, the fourth section 221, the fifth section 222, and the sixth section 223 as noncontiguous sections separated by the plurality of gaps 146, with each section having a corresponding post of the plurality of lower boat posts 126 holding each of the fourth section 221, the fifth section 222, and the sixth section 223 in place. Thus, both the plurality of adiabatic plates 120 and the bottom plate 124 may be noncontiguous from the plurality of gaps 146 and the plurality of gaps 148. As a result, the lower boat segment 106 may be only contiguous in the top plate 122, with the plurality of lower boat posts 126 conductively isolated below the top plate 122. Conductive heat transfer between the plurality of lower boat posts 126 is thus decreased, increasing the thermodynamic stability of the plurality of wafers 102 undergoing processing in the upper boat segment 104. Furthermore, individual hot and cold spots formed in the process chamber 50 during processing can be more readily identified, as the thermodynamic effects may be more localized across the cross-section of the segmented vertical wafer boat 100.

Furthermore, since the plurality of lower boat posts 126 may penetrate each of the plurality of adiabatic plates 120, the diameter of the adiabatic plates may exceed that of the plurality of dummy wafers 160. For example, the plurality of dummy wafers 160 may be sized to fit in slots designed for a 300 mm wafer. The plurality of adiabatic plates 120 are not so restricted, and thus may have a larger diameter greater than the wafers being processed. For example, in a 300 mm plant where the plurality of wafers 102 have a diameter of 300 mm, the plurality of adiabatic plates 120 may have a diameter of 310 mm, 320 mm, 330 mm, or more. However, in other embodiments, the wafer is not limited to a 300 mm process size sizes, and may include 100 mm wafers, 200 mm wafers, 450 mm wafers, and any other sized substrates known in the art.

The additional room for thermal expansion and method of joining allows the plurality of adiabatic plates 120 to also be thicker than the plurality of dummy wafers 160. For example, the plurality of dummy wafers 160, when used in 300 mm processes, are about 4 mm thick, in order to use slots designed for production wafers. However, the example embodiment allows the plurality of adiabatic plates 120 to be larger than the size of the plurality of dummy wafers 160. For example, if the plurality of dummy wafers 160 are 300 mm wafers with a thickness of 4 mm, the plurality of adiabatic plates 120 may be 6 mm or more. Increasing the thickness of the plurality of adiabatic plates 120 increases the mass of each plate, which further increases the heat stabilization effect of each individual plate. Further, as discussed above, the diameter of each of the plurality of adiabatic plates 120 may exceed those of a wafer, with an increase in diameter further increasing the mass of each individual plate. Thus, while a dummy-plate process may use, for example, eight or more quartz plates, example embodiments have reduced the number of required plates to five silicon carbide adiabatic plates.

Figure 6:
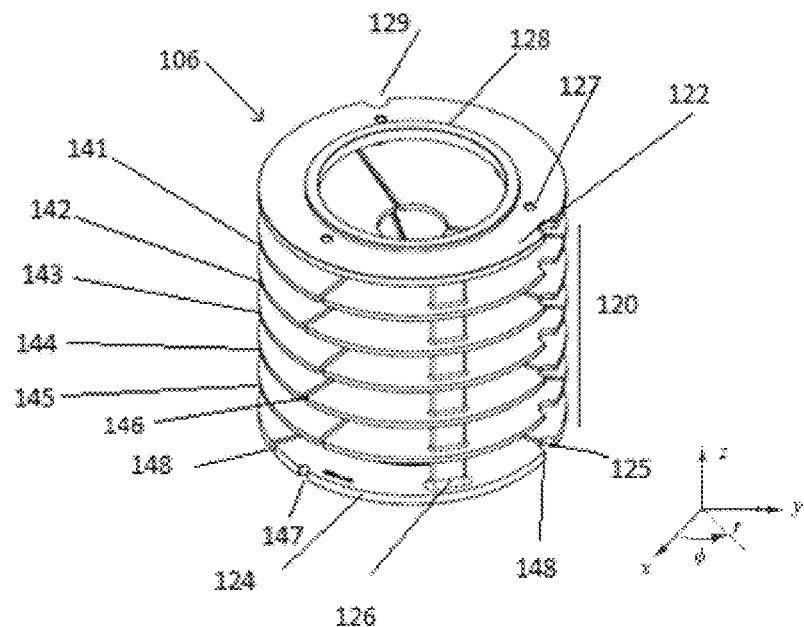
FIG. 6 is a perspective view of a lower boat segment according to an example embodiment of the present inventive concept.
Figure 7:
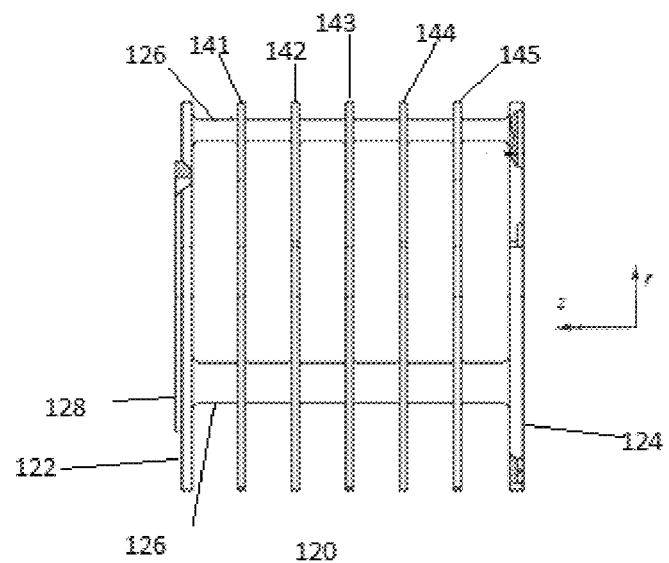
FIG. 7 is a side view of a lower boat segment according to an example embodiment of the present inventive concept.

The first set of plates 210 and the second set of plates 220 are shown as alternating in FIG. 6 and FIG. 7. In the first set of plates 210, the plurality of gaps 146 are angularly offset from the notches 214. However, in the second set of plates 220, the plurality of gaps 146 are aligned with the notches 224. The plurality of gaps 146 in the first set of plates 210 and the second set of plates 220 are thus staggered. Staggering the plurality of gaps 146 in the plurality of adiabatic plates 120 prevents a stack effect, also known as a chimney effect, from occurring in the lower boat segment 106. A stack effect may be undesirable because the stack effect causes heat to rise quicker within the area of effect. In the context of the adiabatic plates 120, such a stack effect results in warmer gases within the processing chamber 50 rising faster within the plurality of gaps 146 than around the plurality of adiabatic plates 120. The center gap within each of the plurality of adiabatic plates 120 may generally avoid a stack effect, as the center gap is sized to effectively close due to the thermal expansion of the plurality of adiabatic plates 120. Further, the stack effect both changes the flow of heat within the processing chamber 50, as heat would rise within the plurality of gaps 146 faster than around the outside edges of the plurality of the adiabatic plates 120, and the spread of particles within the processing chamber 50, as the stack effect can create an updraft. Staggering the plurality of adiabatic plates 120 thus has the plates in the first set of plates 210 act as a baffle for the plates in the second set of plates 220 and vice versa, thereby preventing the stack effect from forming. Furthermore, in additional embodiments, the staggering may be increased, for example by increasing the offset between sets, or by introducing further sets of plates, and giving each additional set of plates an additional offset.

While example embodiments of the present inventive concept have been particularly shown and described, it will be understood by one of ordinary skill in the art that variations in form and detail may be made therein without departing from the scope of the attached claims.

The invention claimed is:

1. A vertical wafer boat, comprising:
an upper boat segment and a lower boat segment, with the upper boat segment configured to removably mount on the lower boat segment and to receive one or more semiconductor substrates;
the lower boat segment comprising:
a top plate,
a first set of one or more plates, and
a second set of one or more plates;
one or more posts connecting the top plate, the first set of one or more plates, and the second set of one or more plates;
the first set of one or more plates comprising a first set of one or more gaps separating a first plurality of sections;
the second set of one or more plates comprising a second set of one or more gaps separating a second plurality of sections; and
the first set of one or more plates and the second set of one or more plates are interleaved; wherein the first set of one or more gaps and the second set of one or more gaps are angularly offset.

2. The vertical wafer boat of claim 1,
wherein the first set of one or more plates includes an inner circumference and an outer circumference, and the second set of one or more plates includes an inner circumference and an outer circumference;
wherein the outer circumference of the first set of one or more plates and the outer circumference of the second set of one or more plates are substantially equal; and
wherein the inner circumference of the first set of one or more plates and the inner circumference of the second set of one or more plates are substantially equal.

3. The vertical wafer boat of claim 2,
wherein the outer circumference of the first set of one or more plates and the outer circumference of the second set of one or more plates are greater than an outer circumference of the one or more semiconductor substrates; and
wherein the inner circumference of the first set of one or more plates and the inner circumference of the second set of one or more plates are less than the outer circumference of the one or more semiconductor substrates.

4. The vertical wafer boat of claim 2,
wherein the first set of one or more gaps extends in a radial direction from the inner circumference to the outer circumference of the first set of one or more plates;
wherein the second set of one or more gaps extends in a radial direction from the inner circumference to the outer circumference of the second set of one or more plates; and
wherein the first set of one or more gaps and the second set of one or more gaps are angularly offset.

5. The vertical wafer boat of claim 4,
wherein the first set of one or more gaps are spaced at a substantially equal distance around the inner circumference of the first set of one or more plates;
wherein the second set of one or more gaps are spaced at a substantially equal distance around the inner circumference of the second set of one or more plates; and
wherein the first set of one or more gaps are spaced at substantially the same distance of the second set of one or more gaps.

6. The vertical wafer boat of claim 1, wherein the first set of one or more plates, the second set of one or more plates, the upper boat segment and the lower boat segment comprise silicon carbide.

7. The vertical wafer boat of claim 1,
wherein the lower boat segment comprises a lower plate, wherein the first set of one or more plates and the second set of one or more plates are distributed vertically between the top plate and the lower plate; and
wherein the one or more posts penetrate each of the first set of one or more plates and each of the second set of one or more plates.

8. The vertical wafer boat of claim 7, wherein the top plate is contiguous, and wherein the lower plate, the first set of one or more plates, and the second set of one or more plates are noncontiguous.

9. The vertical wafer boat of claim 7, wherein the lower plate is configured to mount on a seal cap of an elevator.

10. A segmented vertical wafer boat comprising:
an upper boat segment configured to removably mount on a lower boat segment, the upper boat segment configured to receive one or more semiconductor substrates; and
the lower boat segment comprises:
one or more plates and one or more posts, the one or more posts orthogonally penetrating the one or more plates; and
each of the one or more plates includes one or more gaps separating each of the one or more plates into a plurality of noncontiguous sections.

11. The segmented vertical wafer boat of claim 10, wherein the one or more gaps comprise a circular center gap and one or more radial gaps, wherein the one or more radial gaps extend in a radial direction from the circular center gap to an outer circumference of each of the one or more plates, and wherein each of the plurality of noncontiguous sections is penetrated by one or more posts.

12. The segmented vertical wafer boat of claim 11, wherein the plurality of noncontiguous sections each form an arcuate shape, wherein the plurality of noncontiguous sections are centered around the circular center gap, and
wherein the plurality of noncontiguous sections are separated into noncontiguous sections by the circular center gap separating an inner circumference of the plurality of noncontiguous sections and the one or more radial gaps.

13. The segmented vertical wafer boat of claim 10, wherein one or more pins removably mount the upper boat segment to the lower boat segment.

14. The segmented vertical wafer boat of claim 10, wherein the one or more posts are affixed to the one or more plates.

15. The segmented vertical wafer boat of claim 10, wherein the one or more plates are ring-shaped, wherein the one or more plates possess an inner diameter and an outer diameter, and wherein each of the one or more gaps comprise an inner gap corresponding to the inner diameter and one or more radial gaps extending from the inner diameter to the outer diameter.

16. The segmented vertical wafer boat of claim 15, wherein the one or more plates comprise silicon carbide.

17. A segmented vertical wafer boat for semiconductor processing comprising:
an upper boat segment and a lower boat segment, the upper boat segment configured to mount on the lower boat segment to receive one or more semiconductor substrates; and the lower boat segment comprising:
one or more plates, each of the one or more plates having an outer diameter greater than an outer diameter of the one or more semiconductor substrates, and each of the one or more plates comprising silicon carbide; and
wherein each of the one or more plates is separated into a plurality of noncontiguous sections.

18. The segmented vertical wafer boat of claim 17, wherein each of the one or more plates has an inner diameter less than an outer diameter of each of the one or more semiconductor substrates.

\* \* \* \* \*